United States Patent
Huang

(10) Patent No.: US 6,845,731 B1
(45) Date of Patent: Jan. 25, 2005

(54) ADDING INTERLOCK FOR PAUSE AFTER POLYIMIDE COATING

(75) Inventor: Chung-Chuan Huang, Jhudong Township, Hsinchu County (TW)

(73) Assignee: Taiwan Semiconductor Manufacturing Co., Inc. (TW)

( * ) Notice: Subject to any disclaimer, the term of this patent is extended or adjusted under 35 U.S.C. 154(b) by 0 days.

(21) Appl. No.: 10/742,201

(22) Filed: Dec. 18, 2003

(51) Int. Cl.$^7$ .............................................. B05C 11/00
(52) U.S. Cl. ...................... 118/702; 118/699; 118/703; 118/707
(58) Field of Search ................... 118/699, 700, 118/701, 702, 703, 707, 500, 503; 414/222.02, 935, 936, 937, 938, 939, 940, 941; 318/565

(56) References Cited

U.S. PATENT DOCUMENTS 6,456,364 B1 * 9/2002 Imai .......................... 355/72
2003/0149506 A1 * 8/2003 Haanstra et al. ............ 700/121

* cited by examiner

Primary Examiner—Chris Fiorilla
Assistant Examiner—George Koch
(74) Attorney, Agent, or Firm—Duane Morris LLP

(57) ABSTRACT

A polyimide processing tool for coating polyimide on a semiconductor wafer is provided with a pause time monitoring means for monitoring the duration of the polyimide processing tool's wafer-transfer robot's pause time. The wafer-transfer robot transfers wafers from polyimide apply tool to polyimide cure bake oven and monitoring the duration of the pause helps prevent undesirably long pauses between polyimide apply of the uncured polyimide and the curing step.

5 Claims, No Drawings

ADDING INTERLOCK FOR PAUSE AFTER POLYIMIDE COATING

FIELD OF THE INVENTION

The present invention relates to semiconductor wafer processing, and more particularly, to a polyimide coating tool for coating semiconductor wafers with polyimide.

BACKGROUND OF THE INVENTION

During semiconductor wafer processing, wafers are coated with polyimide at various points in the process. A layer of uncured polyimide is first applied on a wafer using a polyimide apply tool, such as a spin-apply tool. The polyimide layer is, then, cured by baking the wafer at an appropriate curing temperature in a cure bake oven.

In many semiconductor wafer manufacturing systems, the polyimide apply tool and the cure bake oven are separate equipment and the wafers are transferred from the polyimide apply tool to the cure bake oven by an automated wafer-transfer robot. During a typical manufacturing operation, it may be necessary to stop or pause the operation of the wafer-transfer robot for various reasons. When the wafer-transfer robot is paused, some wafers may get stranded either on the polyimide apply tool after the uncured polyimide has been applied or stranded in transit between the polyimide apply operation and the baking operation. This pause between the polyimide apply operation and the baking operation is usually detrimental to the quality of the as-cured polyimide coating layer and further causes delays in wafer processing. To ensure good quality polyimide coating, preferably the polyimide coating should be bake cured as soon as possible after the polyimide apply operation. When the process is interrupted between the polyimide apply step and the curing step, detrimental defects in the polyimide coating often results causing the affected wafers to be scrapped. This problem is common for most polyimides used in the semiconductor industry. Thus, when the wafer-transfer robot is paused or stopped, stranding wafers between the polyimide apply operation and the cure bake operation, it would be desirable to monitor the length of the pause or stoppage time. However, the polyimide coating tools currently being used in the industry do not provide the means for monitoring the stoppage time.

SUMMARY OF THE INVENTION

According to an embodiment of the present invention, a polyimide processing tool is disclosed for coating polyimide on a semiconductor wafer. The polyimide processing tool comprises a polyimide apply tool for coating uncured polyimide onto the semiconductor wafer, a polyimide cure bake oven for bake curing the polyimide; at least one wafer-transfer robot for automatically transferring at least one semiconductor wafer from the polyimide apply tool to the polyimide cure bake oven; a pause switch for pausing the operation of the wafer-transfer robot; a restart switch for restarting the operation of the wafer-transfer robot from the robot's paused state; and a pause time monitoring means for monitoring the duration of the wafer-transfer robot's pause time. The pause time monitoring means allow the operators to monitor the duration of any pauses between the polyimide apply step and the polyimide bake curing step to help prevent undesirably long pauses that result in defects in the polyimide coating.

DETAILED DESCRIPTION

The present invention defines a polyimide coating tool for coating polyimide on a semiconductor wafer that is configured and adapted to monitor the duration of any pause or stoppage between polyimide apply operation and the polyimide cure bake operation. The polyimide coating tool according to the present invention comprises a polyimide apply tool, such a spin-apply tool, for applying a layer of uncured polyimide onto the semiconductor wafer and a polyimide cure bake oven for curing the uncured polyimide. At least one wafer-transfer robot is provided for automatically transferring the semiconductor wafer from the polyimide apply tool to the polyimide cure bake oven. The polyimide coating tool also includes a pause switch for pausing the operation of the wafer-transfer robot and a restart switch for restarting the operation of the wafer-transfer robot.

The inventors have observed that if the pause between polyimide apply and the baking operations is about 15 minutes or longer, the cured polyimide coatings exhibit many defects and, thus, requiring the affected wafers to be scrapped. Typical defects observed are poor polyimide coating such as localized gathering of the polyimide material. Thus the present invention provides enhancement to the polyimide processing tool to avoid interruptions between the polyimide apply step and the curing step that may exceed the 15 minute limit. This maximum pause time limit for the wafer-transfer robot may vary somewhat from one polyimide processing tool to another and the particular polyimide formulation. However, one of ordinary skill in the art understands that the present invention may be applied to a variety of polyimide processing tools and a variety of polyimide formulations.

According to an embodiment of the present invention, a timer is provided with the polyimide coating tool to monitor the duration of the pause time of the wafer-transfer tool. The timer is incorporated into the polyimide coating tool whereby when the pause switch is activated, pausing the wafer-transfer robot, the timer is triggered to start and when the restart switch is activated, restarting the wafer-transfer robot, the timer stops. The timer records the time elapsed during the time the wafer-transfer robot is paused, thus, allowing the polyimide coating tool operators to monitor whether the pause time has exceeded the 15 minute limit or some other time limit. In an embodiment of the present invention, the timer is a type that displays the time elapsed during the pause time so that elapsed pause time can be monitored on real time basis. The timer is preferably a solid state electronic type but may also be a mechanical type. However, one of ordinary skill in the art understands that any type of timer may be used to monitor the duration of the pause time of the wafer transfer tool.

In another embodiment of the present invention, the polyimide processing tool and its timer may be configured to provide an alarm means, such as a warning signal, to the operator before the pause time actually reached the 15 minute limit. The warning signal may be an audible alarm, a visual alarm, or a combination of both. The warning alarm may be activated by the timer, for example, when the pause time of the wafer-transfer robot reaches 10 minutes. The warning alarm could also be activated at shorter intervals between the first warning alarm and the 15 minute mark.

In another embodiment of the present invention, the polyimide processing tool and its timer may be configured to provide a warning alarm when a paused wafer-transfer robot is restarted. This warning alarm may be used to alert the operator to check the timer to check the elapsed time during the pausing of the wafer-transfer robot. The warning alarm may be an audible or a visual alarm signal.

In another embodiment of the present invention, the polyimide coating tool may include a display unit and a clock that generates a pause-start time stamp on the display unit when the pause switch is activated. When the restart switch is activated, the clock generates a pause-stop time stamp on the display unit. The two time stamps allows one to determine the total elapsed pause time for the wafer-transfer robot by calculating the time elapsed between the two time stamps.

While the foregoing invention has been described with reference to the above embodiments, various modifications and changes can be made without departing from the spirit of the invention. Accordingly, all such modifications and changes are considered to be within the scope of the appended claims.

What is claimed is:

1. A polyimide processing tool for coating polyimide on a semiconductor wafer comprising:
   a polyimide apply tool for coating uncured polyimide onto the semiconductor wafer;
   a polyimide cure bake oven for bake curing the uncured polyimide after the polyimide is coated on to the semiconductor wafer;
   at least one wafer-transfer robot for automatically transferring at least one semiconductor wafer from the polyimide apply tool to the polyimide cure bake oven;
   a pause switch for pausing the operation of the wafer-transfer robot;
   a restart switch for restarting the operation of the wafer-transfer robot from the robot's paused state;
   a pause time monitoring means for monitoring the duration of the wafer-transfer robot's pause time; and
   a display unit and the pause time monitoring means includes a clock that generates a pause-start time stamp when the pause switch is activated, pausing the wafer-transfer robot, and generates a pause-stop time stamp when the restart switch is activated, restarting the wafer-transfer robot, wherein the pause-start time stamp and the pause-stop time stamp are displayed on the display unit.

2. A polyimide processing tool of claim 1, wherein the pause time monitoring means includes a timer that starts when the pause switch is activated, pausing the wafer-transfer robot, and stops when the restart switch is activated, restarting the wafer-transfer robot.

3. A polyimide processing tool of claim 1, further comprising an alarm means for alerting an operator of any pausing or restarting of the wafer-transfer robot.

4. A polyimide processing tool of claim 1, further comprising an alarm means for alerting an operator by generating a first warning alarm signal before a predetermined maximum pause time limit for the wafer-transfer robot is reached.

5. A polyimide processing tool of claim 4, wherein the alarm means generates a warning alarm signal at multiple intervals during the time period between the first warning alarm signal and when the predetermined maximum pause time limit for the wafer-transfer robot is reached.

* * * * *